United States Patent
Lu et al.

(10) Patent No.: US 12,433,022 B2
(45) Date of Patent: Sep. 30, 2025

(54) DISPLAY PANEL MANUFACTURING METHOD AND DISPLAY PANEL

(71) Applicant: TCL CHINA STAR OPTOELECTRONICS TECHNOLOGY CO., LTD., Guangdong (CN)

(72) Inventors: Macai Lu, Guangdong (CN); Jiangbo Yao, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 21 days.

(21) Appl. No.: 17/622,801

(22) PCT Filed: Dec. 16, 2021

(86) PCT No.: PCT/CN2021/138810
§ 371 (c)(1),
(2) Date: Dec. 25, 2021

(87) PCT Pub. No.: WO2023/103007
PCT Pub. Date: Jun. 15, 2023

(65) Prior Publication Data
US 2024/0038784 A1    Feb. 1, 2024

(30) Foreign Application Priority Data
Dec. 10, 2021    (CN) ..................... 202111508213.1

(51) Int. Cl.
*H10D 86/60*    (2025.01)
*H01L 25/16*    (2023.01)
(Continued)

(52) U.S. Cl.
CPC .......... *H10D 86/60* (2025.01); *H01L 25/167* (2013.01); *H10D 86/021* (2025.01); *H10D 86/481* (2025.01)

(58) Field of Classification Search
CPC ............... H01L 27/1255; H01L 25/167; H01L 27/1259
(Continued)

(56) References Cited

U.S. PATENT DOCUMENTS 10,991,783 B2 *    4/2021    Cha ....................... G09G 3/3225
12,079,432 B2 *    9/2024    Kim ....................... H10K 59/40
(Continued)

FOREIGN PATENT DOCUMENTS

CN    106406622 A    2/2017
CN    107799532 A    3/2018
(Continued)

OTHER PUBLICATIONS

Japanese Office Action issued in corresponding Japanese Patent Application No. 特願2021-577835 dated Feb. 6, 2024, pp. 1-7.
(Continued)

*Primary Examiner* — Ori Nadav
(74) *Attorney, Agent, or Firm* — PV IP PC; Wei Te Chung

(57) ABSTRACT

An embodiment of the present application discloses a display panel manufacturing method and a display panel including a driver transistor, a storage capacitor, a switch transistor, and a sensing transistor vertically stacked. At leas two transistors are vertically stacked to solve a technical issue that a pixel in a conventional display panel employs a pixel circuit design of transistors and capacitors arranged along a direction parallel to the display panel to cause a lowered pixel density of the display panel to result in a lowered resolution of a display panel product.

15 Claims, 8 Drawing Sheets

(51) Int. Cl.
  *H10D 86/01* (2025.01)
  *H10D 86/40* (2025.01)

(58) Field of Classification Search
  USPC .......................................................... 257/71
  See application file for complete search history.

(56) References Cited

U.S. PATENT DOCUMENTS

| | | |
|---|---|---|
| 2013/0229400 A1 | 9/2013 | Kim et al. |
| 2016/0064421 A1 | 3/2016 | Oh et al. |
| 2018/0166015 A1* | 6/2018 | Beak .................. H10K 59/1213 |
| 2018/0182832 A1 | 6/2018 | Lee et al. |
| 2020/0083309 A1 | 3/2020 | Wang et al. |
| 2021/0104558 A1 | 4/2021 | Kim et al. |

FOREIGN PATENT DOCUMENTS

| | | |
|---|---|---|
| CN | 108231830 A | 6/2018 |
| CN | 108735792 A | 11/2018 |
| CN | 109449188 A | 3/2019 |
| CN | 109742131 A | 5/2019 |
| CN | 111771283 A | 10/2020 |
| CN | 112420745 A | 2/2021 |
| CN | 112750859 A | 5/2021 |
| CN | 112750861 A | 5/2021 |
| JP | 2020205388 A | 12/2020 |
| JP | 2021092755 A | 6/2021 |
| KR | 20160043327 A | 4/2016 |
| WO | 2011037003 A1 | 3/2011 |
| WO | 2011135908 A1 | 11/2011 |

OTHER PUBLICATIONS

International Search Report in International application No. PCT/CN2021/138810, mailed on Apr. 27, 2022.

Written Opinion of the International Search Authority in International application No. PCT/CN2021/138810, mailed on Apr. 27, 2022.

Chinese Office Action issued in corresponding Chinese Patent Application No. 202111508213.1 dated Jul. 27, 2024, pp. 1-7.

* cited by examiner

DISPLAY PANEL MANUFACTURING METHOD AND DISPLAY PANEL

FIELD OF INVENTION

The present application relates to a fields of display panels, especially to a display panel manufacturing method and a display panel.

BACKGROUND OF INVENTION

With development of display technologies, active light emission display panels such as thin film transistor (TFT) substrate of organic light emitting diode (OLED) display panel, micro light emitting diode (Micro LED) display panel, and mini light emitting diode (Mini LED) display panel have advantages of high contrast, high color gamut, light weight and thinness, etc.

A conventional large size OLED, Micro LED, Mini LED uses a design of 3T1C outer compensation pixel circuit, one pixel requires three thin film transistors and one storage capacitor. Furthermore, in the display panel, the three thin film transistors are arranged along a direction parallel to the display panel to result in a size of the pixel unable to be reduced. When the display panel requires better electrical characteristics, one pixel requires more than four thin film transistors, which causes further increase of the size of the pixel to lower a pixel density to result in an issue of a lowered resolution of a display panel product.

SUMMARY OF INVENTION

Technical Issue

A main objective of the present application is to provide a display panel manufacturing method and a display panel to solve a technical issue that a pixel in a conventional display panel employs a pixel circuit design including TFTs and capacitors arranged along a horizontal direction parallel to the display panel to cause a lowered pixel density of the display panel and results in a lowered resolution of the display panel product.

Technical Solution

In an aspect, the embodiment of the present application provides a display panel manufacturing method, comprising:
  forming a buffer layer on underlay substrate, and forming a first semiconductor element on the buffer layer;
  forming a first insulation layer on the first semiconductor element and the buffer layer, forming first metal wiring layer on the first insulation layer, patterning the first metal wiring layer to form a second gate electrode and a first electrode plate of a storage capacitor, wherein the second gate electrode is located above the first semiconductor element;
  forming a first interlayer dielectric layer on the buffer layer, the first semiconductor element, and the first metal wiring layer, forming a second metal wiring layer on the first interlayer dielectric layer, and patterning the second metal wiring layer to form a second source electrode and a second drain electrode, wherein the first semiconductor element, the second gate electrode, the second source electrode, and the second drain electrode constitute a driver transistor;
  forming a second interlayer dielectric layer on the second metal wiring layer, and forming a second semiconductor element and third semiconductor element on the second interlayer dielectric layer; and
  forming a second insulation layer on the second interlayer dielectric layer, the second semiconductor element, and the third semiconductor element, forming a third metal wiring layer on the second insulation layer, patterning the third metal wiring layer to form a first gate electrode, first source electrode, first drain electrode, third gate electrode, third source electrode, third drain electrode, wherein the first gate electrode, first source electrode, first drain electrode constitute a switch transistor, the third gate electrode, third source electrode, third drain electrode constitute a sensing transistor.

In some embodiments of the present application, the method further comprises:
  forming a passivation layer covering the third metal wiring layer, forming a planarization layer on the passivation layer; and
  forming an electrode layer on the planarization layer, disposing a light emitting diode on the electrode layer;
  wherein an orthogonal projection of the switch transistor on the underlay substrate at least partially overlaps an orthogonal projection of the driver transistor on the underlay substrate, or at least partially overlaps an orthogonal projection of the storage capacitor on the underlay substrate;
  wherein the orthogonal projection of the sensing transistor on the underlay substrate at least partially overlaps the orthogonal projection of the driver transistor on the underlay substrate, or at least partially overlaps the orthogonal projection of the storage capacitor on the underlay substrate.

In some embodiments of the present application, the storage capacitor and the driver transistor are arranged along a direction parallel to the underlay substrate, and the storage capacitor is electrically connected to the driver transistor;
  the switch transistor and the driver transistor are arranged along a direction perpendicular to the underlay substrate; and
  the sensing transistor and the driver transistor are arranged along the direction parallel to the underlay substrate, and the sensing transistor and the storage capacitor are arranged along the direction perpendicular to the underlay substrate.

In another aspect, the embodiment of the present application also provides a display panel, comprising:
  an underlay substrate;
  at least one pixel circuit disposed on the underlay substrate, and comprising:
  a driver transistor disposed on the underlay substrate;
  a storage capacitor disposed on the underlay substrate and electrically connected to the driver transistor;
  a switch transistor disposed on the underlay substrate;
  a sensing transistor disposed on the underlay substrate; and
  a light emitting diode disposed on the underlay substrate and electrically connected to the driver transistor and the sensing transistor;
  wherein an orthogonal projection of the switch transistor on the underlay substrate at least partially overlaps an orthogonal projection of the driver transistor on the underlay substrate, or at least partially overlaps an orthogonal projection of the storage capacitor on the underlay substrate.

In some embodiments of the present application, the orthogonal projection of the sensing transistor on the underlay substrate at least partially overlaps the orthogonal projection of the driver transistor on the underlay substrate, or at least partially overlaps the orthogonal projection of the storage capacitor on the underlay substrate.

In some embodiments of the present application, the storage capacitor and the driver transistor are arranged along a direction parallel to the underlay substrate;
the switch transistor and the driver transistor are arranged along a direction perpendicular to the underlay substrate; and
the sensing transistor and the driver transistor are arranged along the direction parallel to the underlay substrate, and the sensing transistor and the storage capacitor are arranged along the direction perpendicular to the underlay substrate.

In some embodiments of the present application, the storage capacitor comprises a first electrode plate and a second electrode plate, the first electrode plate and a second source electrode or a second drain electrode of the driver transistor are disposed in a same layer, and the second electrode plate and an electrode layer connected to the light emitting diode are disposed in a same layer.

In some embodiments of the present application, the first electrode plate and the second electrode plate of the storage capacitor and the sensing transistor are arranged along a direction perpendicular to the underlay substrate, and the sensing transistor is located between the first electrode plate and the second electrode plate.

In some embodiments of the present application, wherein the second source electrode or the second drain electrode of the driver transistor is grounded;
an end of the storage capacitor is grounded;
a first source electrode or a first drain electrode of the switch transistor is electrically connected to another end of the second gate electrode and the storage capacitor of the driver transistor; and
a third source electrode or a third drain electrode of the sensing transistor is grounded.

In some embodiments of the present application, the driver transistor is disposed between the switch transistor and the underlay substrate, and the storage capacitor is disposed between the sensing transistor and the underlay substrate.

In another aspect, the embodiment of the present application also provides a display panel, comprising:
an underlay substrate;
at least one pixel circuit disposed on the underlay substrate, and comprising:
a driver transistor disposed on the underlay substrate;
a storage capacitor disposed on the underlay substrate and electrically connected to the driver transistor;
a switch transistor disposed on the underlay substrate;
a sensing transistor disposed on the underlay substrate; and
a light emitting diode disposed on the underlay substrate and electrically connected to the driver transistor and the sensing transistor;
wherein an orthogonal projection of the switch transistor on the underlay substrate at least partially overlaps an orthogonal projection of the driver transistor on the underlay substrate, or at least partially overlaps an orthogonal projection of the storage capacitor on the underlay substrate;
wherein the orthogonal projection of the sensing transistor on the underlay substrate at least partially overlaps the orthogonal projection of the driver transistor on the underlay substrate, or at least partially overlaps the orthogonal projection of the storage capacitor on the underlay substrate;
wherein the storage capacitor and the driver transistor are arranged along a direction parallel to the underlay substrate; and
wherein the switch transistor and the driver transistor are arranged along a direction perpendicular to the underlay substrate.

In some embodiments of the present application, the sensing transistor and the driver transistor are arranged along the direction parallel to the underlay substrate.

In some embodiments of the present application, the sensing transistor and the storage capacitor are arranged along the direction perpendicular to the underlay substrate.

In some embodiments of the present application, the storage capacitor comprises a first electrode plate and a second electrode plate, the first electrode plate and a second source electrode or a second drain electrode of the driver transistor are disposed in a same layer, and the second electrode plate and an electrode layer connected to the light emitting diode are disposed in a same layer.

In some embodiments of the present application, the first electrode plate and the second electrode plate of the storage capacitor and the sensing transistor are arranged along a direction perpendicular to the underlay substrate.

In some embodiments of the present application, the sensing transistor is located between the first electrode plate and the second electrode plate.

In some embodiments of the present application, the driver transistor is disposed between the switch transistor and the underlay substrate, and the storage capacitor is disposed between the sensing transistor and the underlay substrate.

In some embodiments of the present application, the second source electrode or the second drain electrode of the driver transistor is grounded; and
an end of the storage capacitor is grounded.

In some embodiments of the present application, a first source electrode or a first drain electrode of the switch transistor is electrically connected to another end of the second gate electrode and the storage capacitor of the driver transistor.

In some embodiments of the present application, a third source electrode or a third drain electrode of the sensing transistor is grounded.

Advantages

The present application comprises at least advantages as follows:

The display panel manufacturing method and the display panel provided by the embodiment of the present application configure a driver transistor, a storage capacitor, a switch transistor, and a sensing transistor in a 3T1C pixel circuit to make orthogonal projections thereof on an underlay substrate at least partially overlap one another to achieve vertical stack of the driver transistor, the storage capacitor, the switch transistor, and the sensing transistor, which reduces an area of the pixel along a horizontal direction, solves the technical issue that a pixel in a conventional display panel employs a pixel circuit design including TFTs and capacitors arranged along a horizontal direction parallel to the display panel to cause a lowered pixel density of the display panel and result in a lowered resolution of the display panel product to achieve increase of a pixel density and increase of a resolution of the display panel.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may acquire other figures according to the appended figures without any creative effort.

DETAILED DESCRIPTION OF PREFERRED EMBODIMENTS

The technical solution in the embodiment of the present application will be clearly and completely described below with reference to the accompanying drawings in the embodiments of the present application. Apparently, the described embodiments are merely some embodiments of the present application instead of all embodiments. According to the embodiments in the present application, all other embodiments obtained by those skilled in the art without making any creative effort shall fall within the protection scope of the present application. In addition, it should be understood that the specific embodiments described here are only used to illustrate and explain the present application, and are not used to limit the present application.

An objective of the present application is to provide a display panel manufacturing method and a display panel to solve a technical issue that a pixel in a conventional display panel employs a pixel circuit design including thin film transistors (TFTs) and capacitors arranged along a horizontal direction parallel to the display panel to cause a lowered pixel density of the display panel and results in a lowered resolution of the display panel product.

Figure 1:
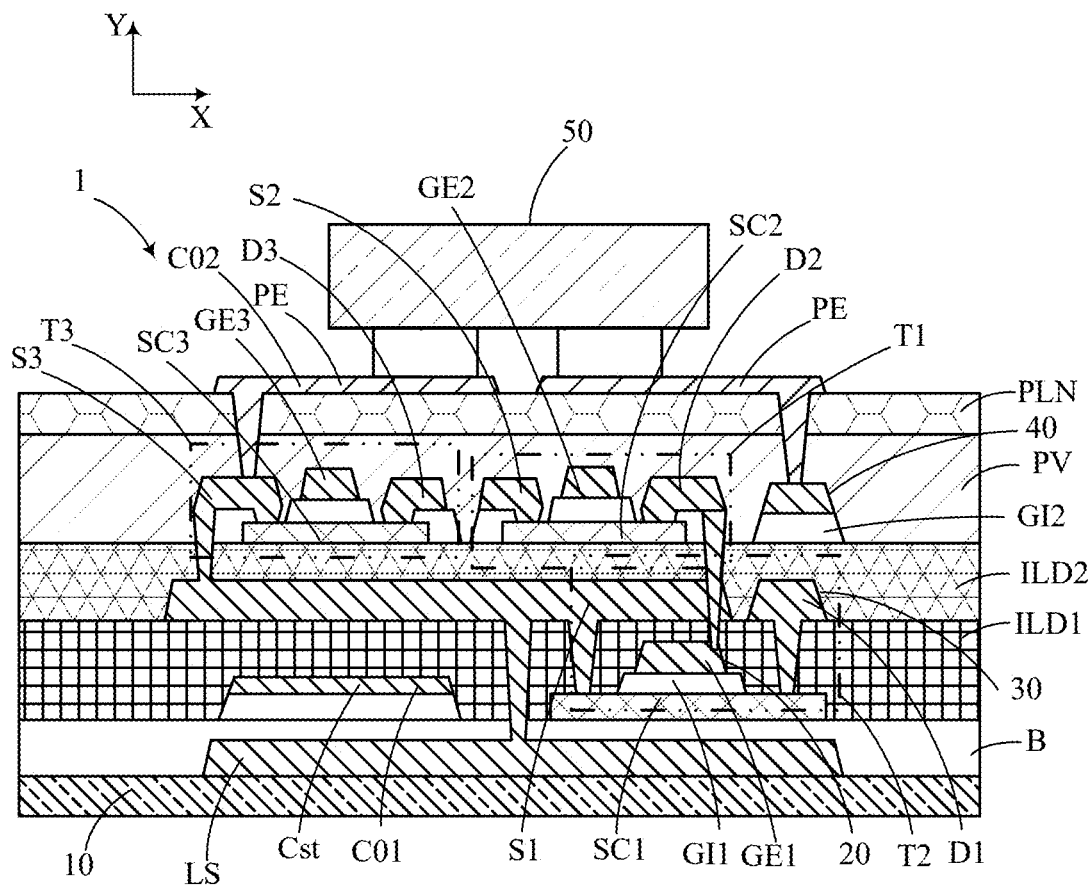
FIG. 1 is a cross-sectional view of a thin film transistor (TFT) substrate of a display panel of an embodiment of the present application.
Figure 2:
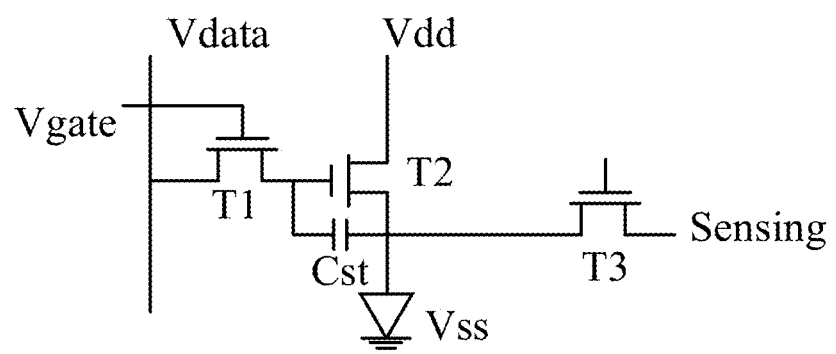
FIG. 2 is a pixel circuit diagram of the display panel of the embodiment of the present application.
Figure 3:
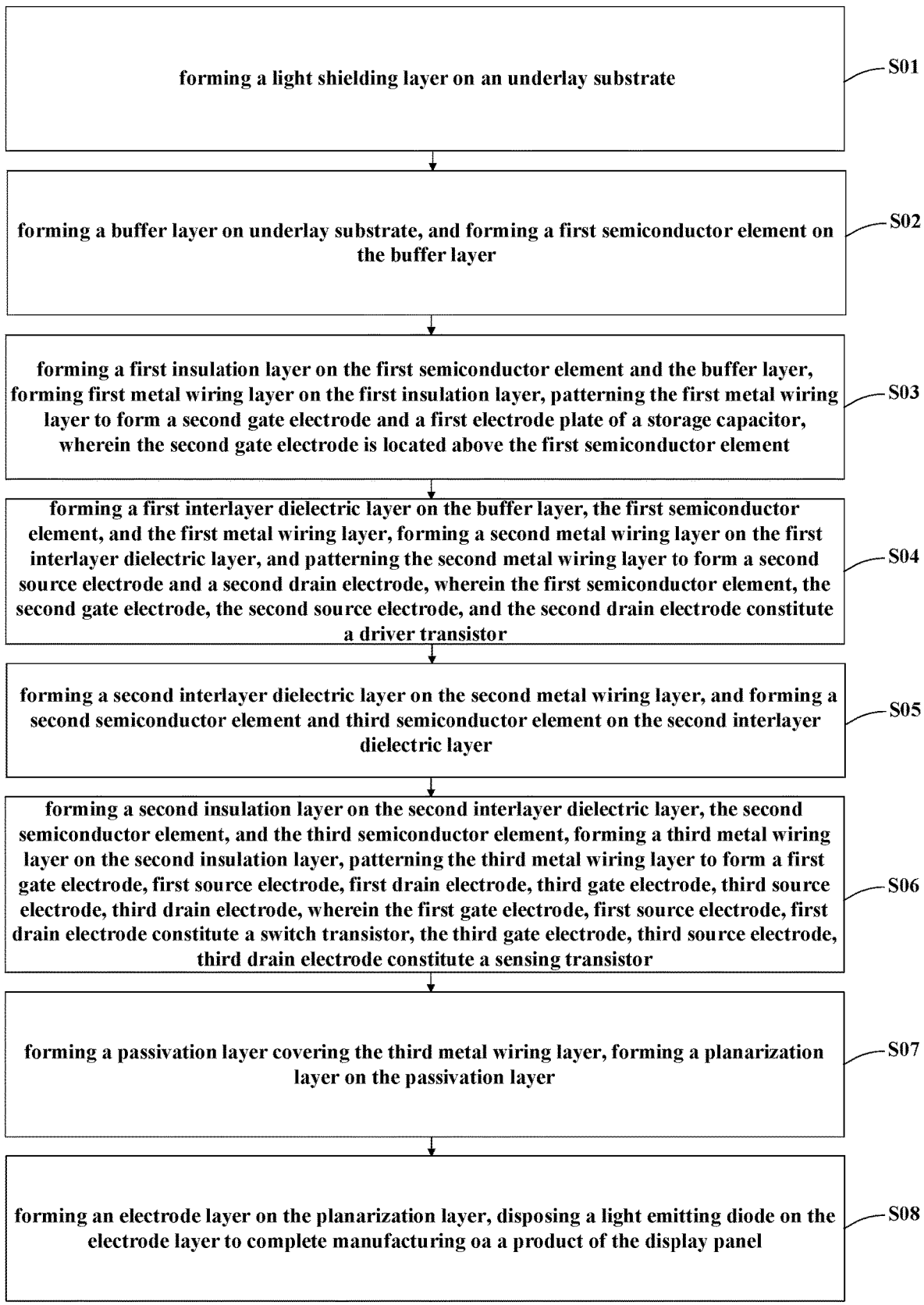
FIG. 3 is a flowchart of a display panel manufacturing method of the embodiment of the present application.

With reference to FIGS. 1 to 3, the embodiment of the present application provides a display panel manufacturing method for manufacturing a display panel including a 3T1C pixel circuit as shown in FIGS. 1 and 2. The manufacturing method can also be configured for manufacturing a display panel including a 4T1C pixel circuit or a display panel including more TFTs based on the same principles.

With reference to FIG. 3, the above display panel manufacturing method comprises steps as follows:

A step S01 comprises forming a light shielding layer on an underlay substrate.

Figure 4:
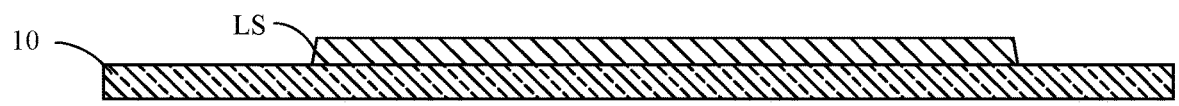
FIG. 4 is a cross-sectional view of a display panel semi-finished product corresponding to the step S01 of the manufacturing method of the embodiment of the present application.

With reference to FIG. 4, in the above step, the light shielding layer LS is formed on the underlay substrate 10. The light shielding layer LS is not an essential structure of the display panel, and therefore the step S01 can be omitted. The light shielding layer LS is configured to prevent unnecessary light leakage of the display panel, and it can be a metal layer.

A step S02 comprises forming a buffer layer on underlay substrate, and forming a first semiconductor element on the buffer layer.

Figure 5:
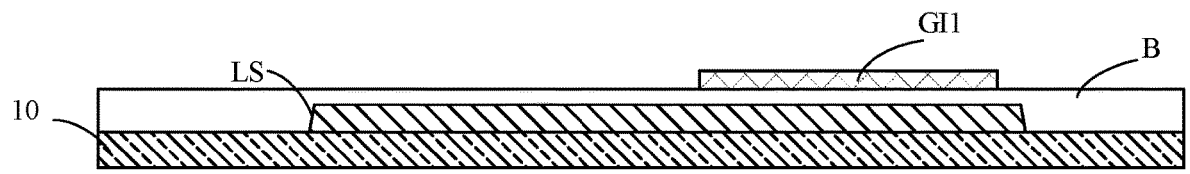
FIG. 5 is a cross-sectional view of a display panel semi-finished product corresponding to the step S02 of the manufacturing method of the embodiment of the present application.

With reference to FIG. 5, in the above step, the buffer layer B is formed on the underlay substrate 10 and the light shielding layer LS, and the first semiconductor element SC1 is formed on the buffer layer B. The first semiconductor element SC1 is configured to constitute a later driver transistor, which will be further described in the following description.

A step S03 comprises forming a first insulation layer on the first semiconductor element and the buffer layer, forming first metal wiring layer on the first insulation layer, patterning the first metal wiring layer to form a second gate electrode and a first electrode plate of a storage capacitor, wherein the second gate electrode is located above the first semiconductor element. The first semiconductor element SC1 can be further for constituting a driver transistor, which will be described in detail as follows.

Figure 6:
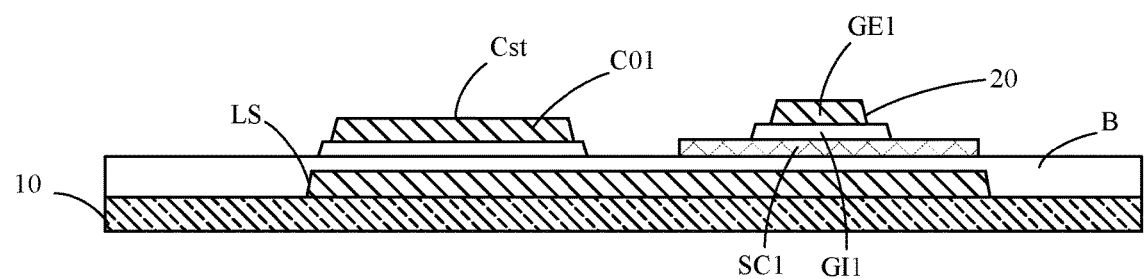
FIG. 6 is a cross-sectional view of a display panel semi-finished product corresponding to the step S03 of the manufacturing method of the embodiment of the present application.

With reference to FIG. 6, in the above step, the first insulation layer GI1 is formed on the first semiconductor element SC1 and the buffer layer B. The first metal wiring layer 20 is formed on the first insulation layer GI1. The first metal wiring layer 20 is patterned to form a second gate electrode GE1 and a first electrode plate C01 of a storage capacitor Cst. The second gate electrode GE1 is located on the first semiconductor element SC1.

A step S04 comprises forming a first interlayer dielectric layer on the buffer layer, the first semiconductor element, and the first metal wiring layer, forming a second metal wiring layer on the first interlayer dielectric layer, and patterning the second metal wiring layer to form a second source electrode and a second drain electrode, wherein the first semiconductor element, the second gate electrode, the second source electrode, and the second drain electrode constitute a driver transistor.

Figure 7:
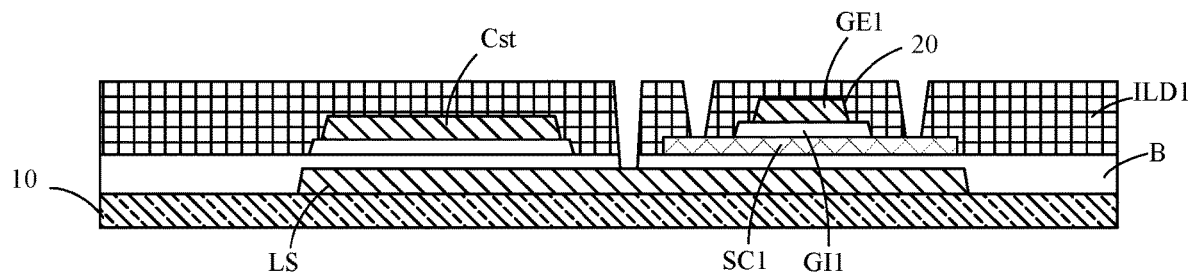
FIG. 7 is a cross-sectional view of a display panel semi-finished product corresponding to the step S04 of the manufacturing method of the embodiment of the present application.
Figure 8:
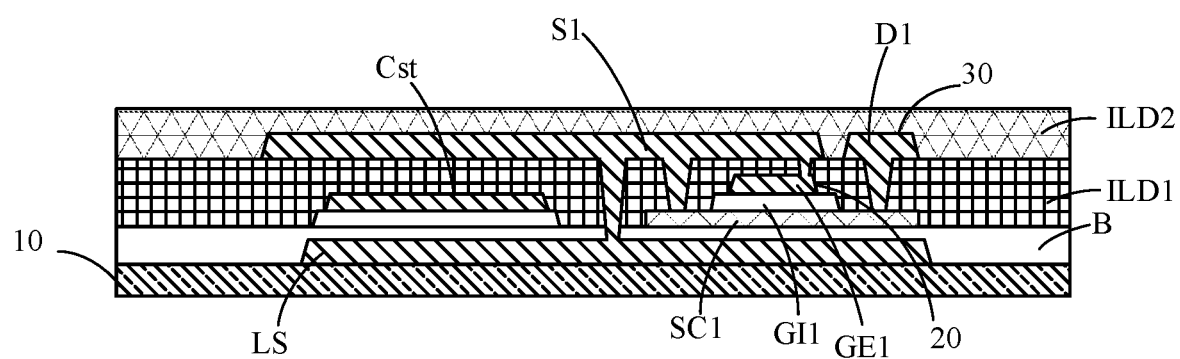
FIG. 8 is a cross-sectional view of a display panel semi-finished product corresponding to the step S04 and the step S05 of the manufacturing method of the embodiment of the present application.

With reference to FIGS. 7 and 8, in the above step, the first interlayer dielectric layer ILD1 is formed on the buffer layer B, the first semiconductor element SC1, and the first metal wiring layer 20. The second metal wiring layer 30 is formed on the first interlayer dielectric layer ILD1, and the second metal wiring layer 30 is patterned to form a second source electrode S1 and a second drain electrode D1 corresponding to the second gate electrode GE1. The first semiconductor element SC1, the second gate electrode GE1, the S1 and the second drain electrode D1 constitute a driver transistor T2. The driver transistor T2 can be further configured to constitute a 3T1C pixel circuit. A step S05 comprises forming a second interlayer dielectric layer on the second metal wiring layer, and forming a second semiconductor element and third semiconductor element on the second interlayer dielectric layer.

Figure 9:
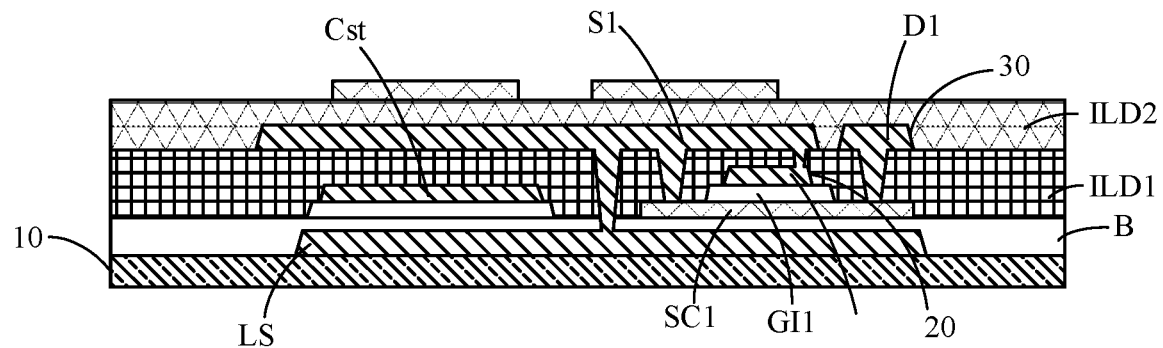
FIG. 9 is a cross-sectional view of a display panel semi-finished product corresponding to the step S05 of the manufacturing method of the embodiment of the present application.

With reference to FIGS. 8 and 9, in the above step, the second interlayer dielectric layer ILD2 is formed on the second metal wiring layer 30. The second semiconductor element SC2 and the third semiconductor element SC3 are formed on the second interlayer dielectric layer ILD2. The second interlayer dielectric layer ILD2 is configured for insulation between the metal wiring layer and the semiconductor element.

A step S06 comprises forming a second insulation layer on the second interlayer dielectric layer, the second semiconductor element, and the third semiconductor element, forming a third metal wiring layer on the second insulation layer, patterning the third metal wiring layer to form a first gate electrode, first source electrode, first drain electrode, third gate electrode, third source electrode, third drain electrode, wherein the first gate electrode, first source electrode, first drain electrode constitute a switch transistor, the third gate electrode, third source electrode, third drain electrode constitute a sensing transistor.

Figure 10:
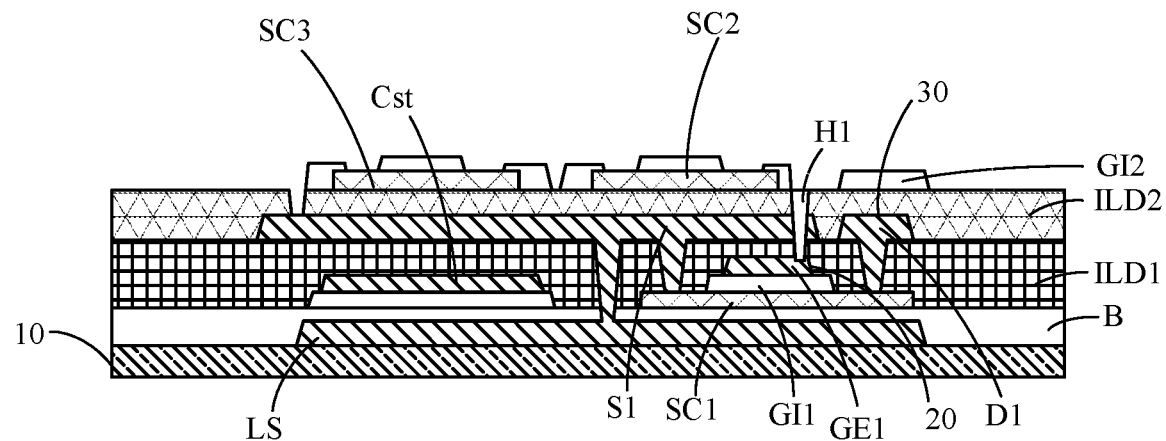
FIG. 10 is a cross-sectional view of a display panel semi-finished product corresponding to the step S06 of the manufacturing method of the embodiment of the present application.
Figure 11:
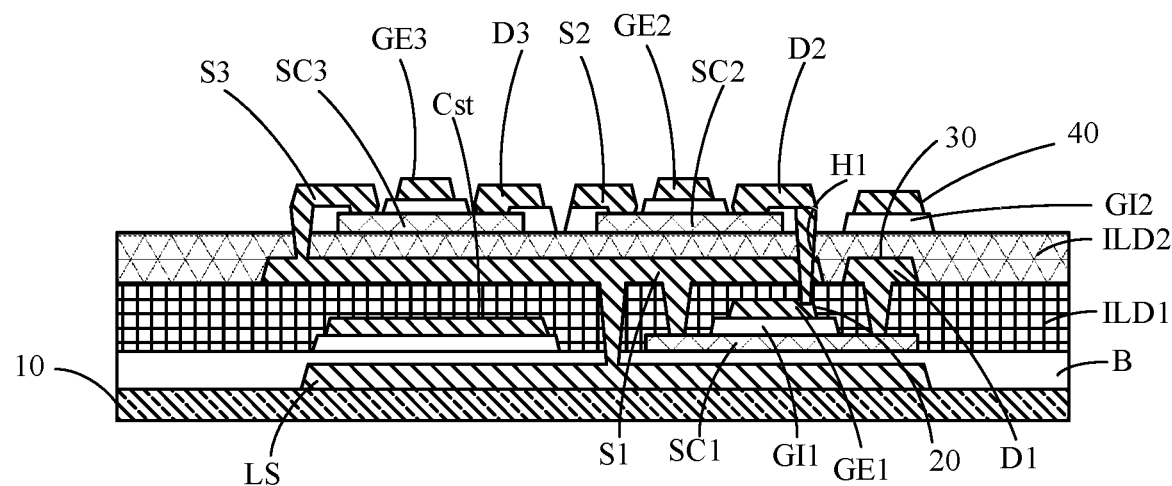
FIG. 11 is a cross-sectional view of another display panel semi-finished product corresponding to the step S06 of the manufacturing method of the embodiment of the present application.

With reference to FIGS. 10 and 11, in the above step, the second insulation layer GI2 is formed on the second interlayer dielectric layer ILD2. The second semiconductor element SC2, and the third semiconductor element SC3. The third metal wiring layer 40 is formed on the second insulation layer GI2. The third metal wiring layer 40 is patterned to form a first gate electrode GE2, a first source electrode S2, a first drain electrode D2, a third gate electrode GE3, a third source electrode S3, and a third drain electrode D3. The first gate electrode GE2, the first source electrode S2, and the first drain electrode D2 constitute a switch transistor T1. The third gate electrode GE3, the third source electrode S3, and the third drain electrode D3 constitute a sensing transistor T3. The switch transistor T1, the sensing transistor T3, and the above driver transistor T2 can commonly constitute a 3T1C pixel circuit.

A step S07 comprises forming a passivation layer covering the third metal wiring layer, forming a planarization layer on the passivation layer.

Figure 12:
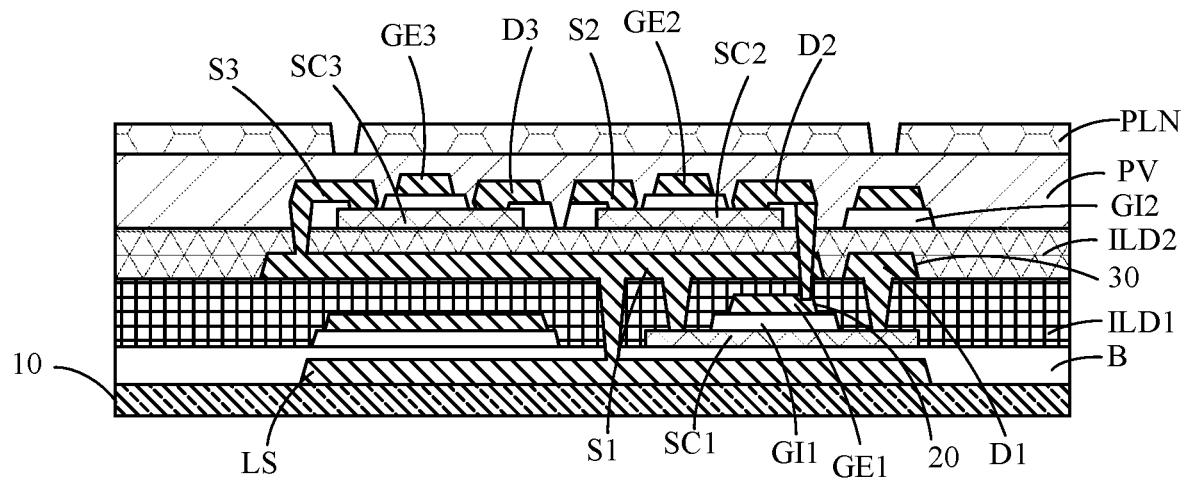
FIG. 12 is a cross-sectional view of a display panel semi-finished product corresponding to the step S07 of the manufacturing method of the embodiment of the present application.
Figure 13:
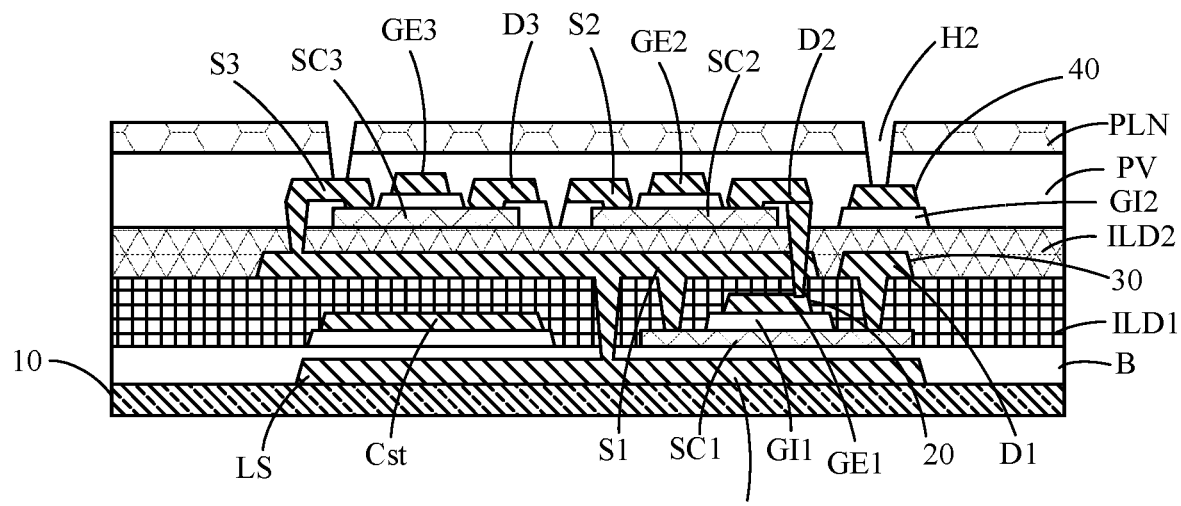
FIG. 13 is a cross-sectional view of another display panel semi-finished product corresponding to the step S07 of the manufacturing method of the embodiment of the present application.

With reference to FIGS. 12 and 13, in the above step, the passivation layer covers the third metal wiring layer 40, the planarization layer PLN is formed on the passivation layer PV.

A step S08 comprises forming an electrode layer on the planarization layer, disposing a light emitting diode on the electrode layer to complete manufacturing of a product of the display panel.

Figure 14:
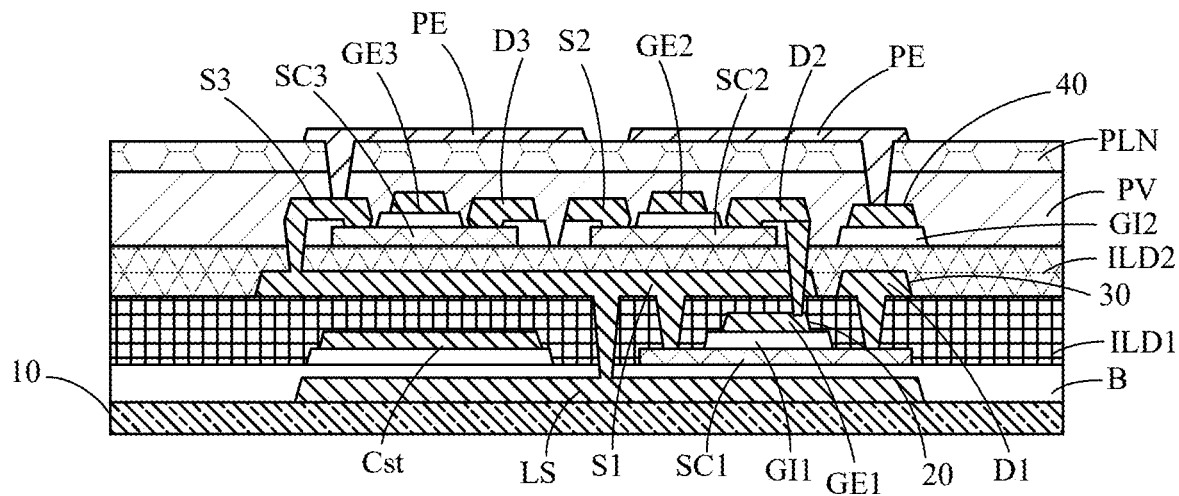
FIG. 14 is a cross-sectional view of a display panel semi-finished product corresponding to the step S08 of the manufacturing method of the embodiment of the present application.
Figure 15:
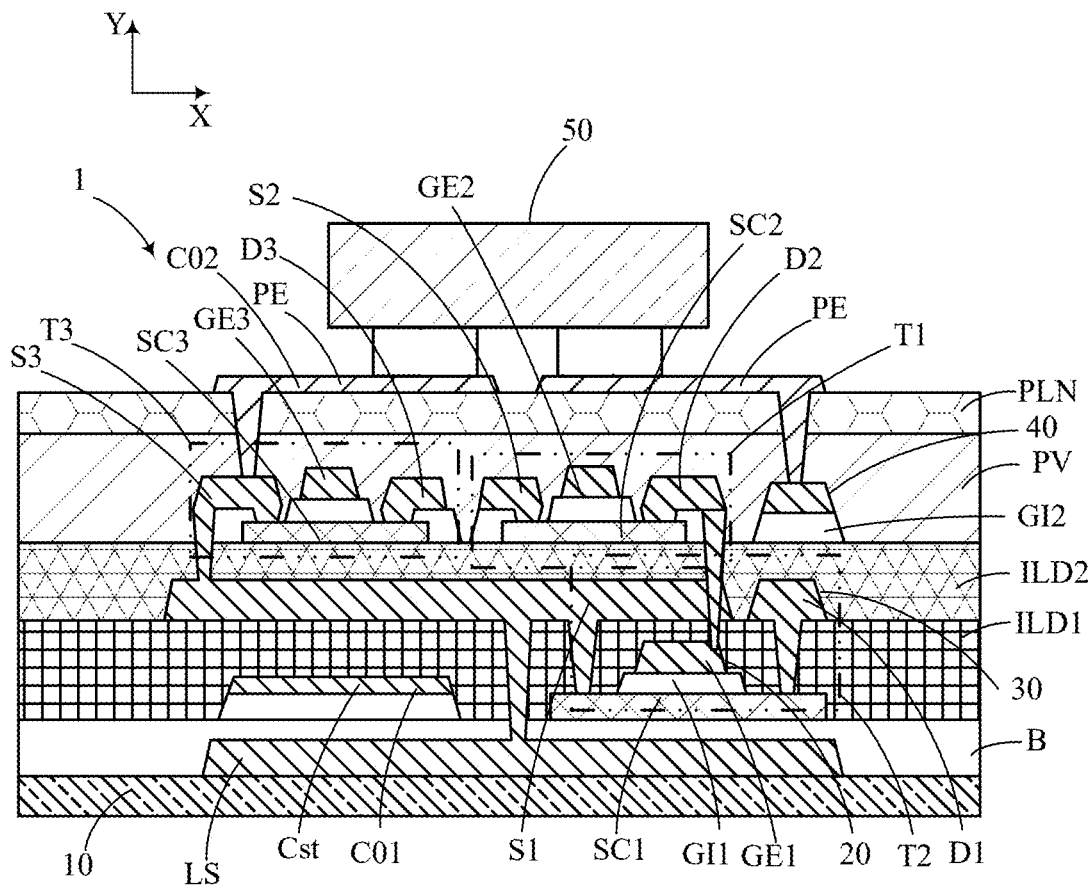
FIG. 15 is a cross-sectional view of a display panel finished product corresponding to the step S08 of the manufacturing method of the embodiment of the present application.

With reference to FIGS. 14 and 15, in the above step, the electrode layer PE is formed on the planarization layer PLN, the light emitting diode 50 is disposed on the electrode layer PE to complete a finished product of the display panel 1. Furthermore, the electrode layer PE and a second electrode plate C02 of the storage capacitor Cst are disposed in a same layer.

An orthogonal projection of the switch transistor T1 on the underlay substrate 10 at least partially overlaps an orthogonal projection of the driver transistor T2 on the underlay substrate 10, or at least partially overlaps an orthogonal projection of the storage capacitor Cst on the underlay substrate 10. The orthogonal projection of the switch transistor T1 at least partially overlapping the orthogonal projection of the driver transistor T2 or the orthogonal projection of the storage capacitor Cst makes the switch transistor T1 and the driver transistor T2 stacked along a vertical direction of the underlay substrate 10, reduces an area of the pixel circuit constituted by the driver transistor T2, the switch transistor T1, and the sensing transistor T3 along a direction parallel to the display panel 1 to further increase a pixel density to improve a resolution of the display panel.

In some embodiments of the present application, the orthogonal projection of the sensing transistor T3 on the underlay substrate 10 at least partially overlaps the orthogonal projection of the driver transistor T2 on the underlay substrate 10, or at least partially overlaps the orthogonal projection of the storage capacitor Cst on the underlay substrate 10. The orthogonal projection the sensing transistor T3 at least partially overlapping the orthogonal projection of the driver transistor T2 or the orthogonal projection of the storage capacitor Cst makes the switch transistor T1 and the driver transistor T2 stacked on the vertical direction of the underlay substrate 10, reduces the area of the pixel circuit constituted by the driver transistor T2, the switch transistor T1, and the sensing transistor T3 along the direction parallel to the display panel 1 and further improve the pixel density.

In some embodiments of the present application, the storage capacitor Cst and the driver transistor T2 are arranged along a direction X parallel to the underlay substrate 10, and are electrically connected to the driver transistor T2. The switch transistor T1 and the driver transistor T2 are arranged along a direction Y perpendicular to the underlay substrate 10. The sensing transistor T3 and the driver transistor T2 are arranged along the direction X parallel to the underlay substrate 10, and the sensing transistor T3 and the storage capacitor Cst are arranged along the direction Y perpendicular to the underlay substrate 10. In some embodiments of the present application, the light emitting diode 50 is electrically connected to the driver transistor T2, the switch transistor T1, and the sensing transistor T3 through the electrode layer PE.

In some embodiments of the present application, the first source electrode S2 or the first drain electrode D2 is electrically connected to the second gate electrode GE1 through a first via hole H1 defined through the second interlayer dielectric layer ILD2, and the electrode layer PE is electrically connected to the switch transistor T1 and the sensing transistor T3 through a second via hole H2 defined through the passivation layer and the planarization layer PLN.

With further reference to FIGS. 1 and 2, in another aspect, the embodiment of the present application a display panel 1 comprising: an underlay substrate 10 and at least one pixel circuit.

The pixel circuit is disposed on the underlay substrate 10 and comprises: a driver transistor T2, a storage capacitor Cst, a switch transistor T1, a sensing transistor T3, and a light emitting diode 50.

The driver transistor T2 is disposed on the underlay substrate 10.

The storage capacitor Cst is disposed on the underlay substrate 10 and is electrically connected to the driver transistor T2. Furthermore, the storage capacitor Cst comprises a first electrode plate C01 and a second electrode plate C02, as shown in FIG. 1.

The switch transistor T1 is disposed on the underlay substrate 10.

The sensing transistor T3 is disposed on the underlay substrate 10.

The light emitting diode 50 is disposed on the underlay substrate 10 and is electrically connected to the driver transistor T2 and the sensing transistor T3.

An orthogonal projection of the switch transistor T1 on the underlay substrate 10 at least partially overlaps an orthogonal projection of the driver transistor T2 on the underlay substrate 10, or at least partially overlaps an orthogonal projection of the storage capacitor Cst on the underlay substrate 10. The orthogonal projection of the switch transistor T1 at least partially overlapping the orthogonal projection of the driver transistor T2 or the orthogonal projection of the storage capacitor Cst makes the switch transistor T1 and the driver transistor T2 stacked along the vertical direction of the underlay substrate 10, reduces the area of the pixel circuit constituted by the driver transistor T2, the switch transistor T1, and the sensing transistor T3 along the direction parallel to the display panel 1, and further improves the pixel density.

The orthogonal projection of the sensing transistor T3 on the underlay substrate 10 at least partially overlaps the orthogonal projection of the driver transistor T2 on the underlay substrate 10, or at least partially overlaps the orthogonal projection of the storage capacitor Cst on the underlay substrate 10. The orthogonal projection of the sensing transistor T3 at least partially overlapping the orthogonal projection of the driver transistor T2 or the orthogonal projection of the storage capacitor Cst, makes the switch transistor T1 and the driver transistor T2 stacked along the vertical direction of the underlay substrate 10, reduces the area of the pixel circuit constituted by the driver transistor T2, the switch transistor T1, and the sensing transistor T3 along the direction parallel to the display panel 1 and further improves the pixel density.

In some embodiments of the present application, the storage capacitor Cst and the driver transistor T2 are arranged along the direction X parallel to the underlay substrate 10. The switch transistor T1 and the driver transistor T2 are arranged along the direction Y perpendicular to the underlay substrate 10. The sensing transistor T3 and the driver transistor T2 are arranged along the direction X parallel to the underlay substrate 10, and the sensing transistor T3 and the storage capacitor Cst are arranged along the direction Y perpendicular to the underlay substrate 10.

In some embodiments of the present application, the storage capacitor Cst comprises a first electrode plate C01 and a second electrode plate C02. The first electrode plate C01 and a second source electrode S1 or a second drain electrode D1 of the driver transistor T1 are disposed in a same layer. The second electrode plate C02 and an electrode layer PE of the light emitting diode 50 are disposed in a same layer.

In some embodiments of the present application, the first electrode plate C01 of the storage capacitor Cst and the second electrode plate C02 and the sensing transistor are arranged along the direction Y perpendicular to the underlay substrate 10, and the sensing transistor are located between the first electrode plate C01 and the second electrode plate C02.

In some embodiments of the present application, the second source electrode S1 or the second drain electrode D1 of the driver transistor T2 is grounded.

An end of the storage capacitor Cst is grounded. The first source electrode S2 or the first drain electrode D2 of the switch transistor T1 is electrically connected to the second gate electrode GE1 of the driver transistor T2 and another end of the storage capacitor Cst. The third source electrode S3 or the third drain electrode D3 of the sensing transistor T3 is grounded.

In some embodiments of the present application, the driver transistor T2 is located between the switch transistor T1 and the underlay substrate 10, the storage capacitor Cst is located between the sensing transistor T3 and the underlay substrate 10.

In some embodiments of the present application, the display panel 1 further comprises a light shielding layer LS, a buffer layer B, a first semiconductor element SC1, a first insulation layer GI1, a first metal wiring layer 20, a first interlayer dielectric layer ILD1, a second metal wiring layer 30, a second interlayer dielectric layer ILD2, a second insulation layer GI2, a third metal wiring layer 40, a passivation layer, a planarization layer, and an electrode layer PE that are sequentially stacked on the underlay substrate 10. The second gate electrode GE1 of the driver transistor T2 is formed by patterning the first metal wiring layer 20. The second source electrode S1 and the second drain electrode D1 of the driver transistor T2 are formed by patterning the second metal wiring layer 30. The first source electrode S2, the first drain electrode D2, and first gate electrode GE2 of the switch transistor T1 are formed by patterning the third metal wiring layer 40. The third source electrode S3, the third drain electrode D3, and the third gate electrode GE3 of the sensing transistor T3 are formed by patterning the third metal wiring layer 40. The light emitting diode 50 is disposed on the electrode layer PE. Furthermore, the second electrode plate C02 of the storage capacitor Cst is formed on the electrode layer PE and is vertically opposite to the first electrode plate C01.

The present application comprises at least advantages as follows:

The display panel manufacturing method and the display panel 1 provided by the embodiment of the present application configure a driver transistor T2, a storage capacitor Cst, a switch transistor T1, and a sensing transistor T3 in a 3T1C pixel circuit to make orthogonal projections thereof on an underlay substrate at least partially overlap one another to achieve vertical stack of the driver transistor T2, the storage capacitor Cst, the switch transistor T1, and the sensing transistor T3, which reduces an area of the pixel along a horizontal direction, solves the technical issue that a pixel in a conventional display panel 1 employs a pixel circuit design including TFTs and capacitors arranged along a horizontal direction parallel to the display panel 1 to cause a lowered pixel density of the display panel 1 and result in a lowered resolution of the display panel 1 product to achieve increase of a pixel density and increase of a resolution of the display panel 1.

The display panel manufacturing method and the display panel 1 provided by the embodiment of the present application are described in detail as above.

In the specification, the specific examples are used to explain the principle and embodiment of the present application. The above description of the embodiments is only used to help understand the method of the present application and its spiritual idea. Meanwhile, for those skilled in the art, according to the present the idea of invention, changes will be made in specific embodiment and application. In summary, the contents of this specification should not be construed as limiting the present application.

What is claimed is:

1. A display panel, comprising:
an underlay substrate;
at least one pixel circuit disposed on the underlay substrate, and comprising:
a driver transistor disposed on the underlay substrate;
a storage capacitor disposed on the underlay substrate and electrically connected to the driver transistor;
a switch transistor disposed on the underlay substrate;
a sensing transistor disposed on the underlay substrate; and
a light emitting diode disposed on the underlay substrate and electrically connected to the driver transistor and the sensing transistor;
wherein an orthogonal projection of the switch transistor on the underlay substrate at least partially overlaps an orthogonal projection of the driver transistor on the underlay substrate;
wherein the switch transistor, the sensing transistor, the storage capacitor, and the driver transistor are arranged in an array of two rows extending along a direction parallel to the underlay substrate with the rows arranged along a direction perpendicular to the underlay substrate, an upper one of the two rows includes the switch transistor and the sensing transistor, and a lower one of the two rows includes the storage capacitor and the driver transistor;
wherein the driver transistor is disposed between the switch transistor and the underlay substrate, and the storage capacitor is disposed between the sensing transistor and the underlay substrate.

2. The display panel according to claim 1, wherein the orthogonal projection of the sensing transistor on the underlay substrate at least partially overlaps the orthogonal projection of the driver transistor on the underlay substrate, or at least partially overlaps the orthogonal projection of the storage capacitor on the underlay substrate.

3. The display panel according to claim 1, wherein
the storage capacitor and the driver transistor are arranged along the direction parallel to the underlay substrate;
the switch transistor and the driver transistor are arranged along the direction perpendicular to the underlay substrate; and the sensing transistor and the driver transistor are arranged along the direction parallel to the underlay substrate, and the sensing transistor and the storage capacitor are arranged along the direction perpendicular to the underlay substrate.

4. The display panel according to claim 1, wherein the storage capacitor comprises a first electrode plate and a second electrode plate, the first electrode plate and a second source electrode or a second drain electrode of the driver transistor are disposed in a same layer, and the second electrode plate and an electrode layer connected to the light emitting diode are disposed in a same layer.

5. The display panel according to claim 4, wherein the first electrode plate and the second electrode plate of the storage capacitor and the sensing transistor are arranged along a direction perpendicular to the underlay substrate, and the sensing transistor is located between the first electrode plate and the second electrode plate.

6. The display panel according to claim 1, wherein:
the second source electrode or the second drain electrode of the driver transistor is grounded;
an end of the storage capacitor is grounded;
a first source electrode or a first drain electrode of the switch transistor is electrically connected to another end of the second gate electrode and the storage capacitor; and
a third source electrode or a third drain electrode of the sensing transistor is grounded.

7. A display panel, comprising:
an underlay substrate;
at least one pixel circuit disposed on the underlay substrate, and comprising:
a driver transistor disposed on the underlay substrate;
a storage capacitor disposed on the underlay substrate and electrically connected to the driver transistor;
a switch transistor disposed on the underlay substrate;
a sensing transistor disposed on the underlay substrate; and
a light emitting diode disposed on the underlay substrate and electrically connected to the driver transistor and the sensing transistor;
wherein an orthogonal projection of the switch transistor on the underlay substrate at least partially overlaps an orthogonal projection of the driver transistor on the underlay substrate;
wherein the orthogonal projection of the sensing transistor on the underlay substrate at least partially overlaps the orthogonal projection of the driver transistor on the underlay substrate, or at least partially overlaps the orthogonal projection of the storage capacitor on the underlay substrate;
wherein the storage capacitor and the driver transistor are arranged along a direction parallel to the underlay substrate; and
wherein the switch transistor and the driver transistor are arranged along a direction perpendicular to the underlay substrate;
wherein the switch transistor, the sensing transistor, the storage capacitor, and the driver transistor are arranged an array of two rows extending along the direction parallel to the underlay substrate with the rows arranged along the direction perpendicular to the underlay substrate, an upper one of the two rows includes the switch transistor and the sensing transistor, and a lower one of the two rows includes the storage capacitor and the driver transistor;

wherein the driver transistor is disposed between the switch transistor and the underlay substrate, and the storage capacitor is disposed between the sensing transistor and the underlay substrate.

8. The display panel according to claim 7, wherein the sensing transistor and the driver transistor are arranged along the direction parallel to the underlay substrate.

9. The display panel according to claim 8, wherein the sensing transistor and the storage capacitor are arranged along the direction perpendicular to the underlay substrate.

10. The display panel according to claim 7, wherein the storage capacitor comprises a first electrode plate and a second electrode plate, the first electrode plate and a second source electrode or a second drain electrode of the driver transistor are disposed in a same layer, and the second electrode plate and an electrode layer connected to the light emitting diode are disposed in a same layer.

11. The display panel according to claim 8, wherein the first electrode plate and the second electrode plate of the storage capacitor and the sensing transistor are arranged along a direction perpendicular to the underlay substrate.

12. The display panel according to claim 7, wherein the sensing transistor is located between the first electrode plate and the second electrode plate.

13. The display panel according to claim 7, wherein
the second source electrode or the second drain electrode of the driver transistor is grounded; and
an end of the storage capacitor is grounded.

14. The display panel according to claim 13, wherein a first source electrode or a first drain electrode of the switch transistor is electrically connected to another end of the second gate electrode and the storage capacitor.

15. The display panel according to claim 13, wherein a third source electrode or a third drain electrode of the sensing transistor is grounded.

* * * * *